(12) United States Patent
Natsume et al.

(10) Patent No.: US 7,245,489 B2
(45) Date of Patent: Jul. 17, 2007

(54) AIR CONDITIONING STRUCTURE FOR ELECTRICAL APPLIANCES

(75) Inventors: Yoshihiro Natsume, Hamamatsu (JP); Ryutaro Sugimoto, Hamamatsu (JP); Chikara Ute, Hamamatsu (JP)

(73) Assignee: Yamaha Corporation, Hamamatsu-shi (JP)

( * ) Notice: Subject to any disclaimer, the term of this patent is extended or adjusted under 35 U.S.C. 154(b) by 324 days.

(21) Appl. No.: 11/065,930

(22) Filed: Feb. 25, 2005

(65) Prior Publication Data
US 2005/0195567 A1    Sep. 8, 2005

(30) Foreign Application Priority Data
Feb. 27, 2004   (JP)   ............................. 2004-053350

(51) Int. Cl.
*H05K 7/20*   (2006.01)
(52) U.S. Cl. ...................................... 361/695; 454/184
(58) Field of Classification Search ........ 361/687–695; 454/184
See application file for complete search history.

(56) References Cited

U.S. PATENT DOCUMENTS

| | | | | |
|---|---|---|---|---|
| 4,797,783 A | * | 1/1989 | Kohmoto et al. | 361/695 |
| 5,717,572 A | * | 2/1998 | Smith et al. | 361/695 |
| 5,860,719 A | | 1/1999 | Suzuki et al. | |
| 6,046,921 A | * | 4/2000 | Tracewell et al. | 363/141 |
| 6,333,851 B1 | * | 12/2001 | Shih | 361/695 |
| 6,418,015 B1 | * | 7/2002 | Kociecki | 361/695 |
| 6,488,378 B1 | * | 12/2002 | Tabuchi et al. | 353/52 |
| 6,520,851 B1 | * | 2/2003 | Shih | 454/184 |
| 6,888,725 B2 | * | 5/2005 | Kubo et al. | 361/719 |
| 2003/0002254 A1 | * | 1/2003 | Faneuf et al. | 361/687 |
| 2004/0196631 A1 | * | 10/2004 | Ueda et al. | 361/695 |
| 2004/0207981 A1 | * | 10/2004 | Gorenz et al. | 361/687 |
| 2005/0168940 A1 | * | 8/2005 | Askeland et al. | 361/687 |

FOREIGN PATENT DOCUMENTS

| | | |
|---|---|---|
| JP | 2002-151875 | 5/2002 |
| JP | 2003-076444 | 3/2003 |
| JP | 2003-271073 | 9/2003 |

* cited by examiner

*Primary Examiner*—Gregory Thompson
(74) *Attorney, Agent, or Firm*—Morrison & Foerster LLP

(57) ABSTRACT

An air conditioning structure for an electrical appliance, which is capable of air-cooling at least one heat-generating electrical component part in a housing of the electrical appliance while suppressing leakage of operation noise from an air intake fan to the outside, and also capable of achieving a muffling effect and even enhancing the rigidity of the front part of the housing by the front part being constructed of a double structure. The housing accommodates at least one electrical component part group. In the housing, a double plate assembly has a double structure and is comprised of a front plate and a rear plate. The housing has a rear plate provided with two windows and two exhaust fans, which form an exhaust section. The front plate is formed therein with two outer air intake openings, while the rear plate is formed therein with an inner air intake opening. An air intake fan is provided at the front part of the housing at a location rearward of the outer air intake openings in facing relation to the inner air intake opening, and disposed at such a location that it does not overlap the outer air intake openings at all as viewed from a front side of the housing. The electrical component part group is air-cooled by the air intake fan and the exhaust section.

8 Claims, 4 Drawing Sheets

AIR CONDITIONING STRUCTURE FOR ELECTRICAL APPLIANCES

BACKGROUND OF THE INVENTION

1. Field of the Invention

The present invention relates to an air conditioning structure for electrical appliances, such as power supply units for mixers, which have a housing containing one or more heat-generating electrical component parts.

2. Description of the Related Art

Electrical appliances, such as power supply units for mixers, or personal computers, incorporate various kinds of electrical component parts, such as a stabilized power supply unit and a CPU, and some of the electrical component parts cause large heat generation (each of which will be hereinafter referred to as a "heat-generating electrical component part"). Therefore, conventionally, air conditioning structures for electrical appliances are known in which a cooling fan is provided in a housing so as to cool heat-generating electrical component parts, as disclosed in Japanese Laid-Open Patent Publications (Kokai) No. 2003-271073 and No. 2003-76444.

Particularly, in Japanese Laid-Open Patent Publication No. 2003-76444, a cooling fan dedicated to a CPU is provided separately from a cooling fan for a power supply unit to thereby effectively cool the CPU generating heat.

However, cooling fans cause noise generation while performing the air-cooling function. For this reason, in electrical appliances of which quietness is demanded, it is important not only to cool each heat-generating electrical component part, but also to suppress noise generation by a cooling fan. For example, in a rack-mount power supply unit for mixers which processes recorded data of sound generated by a musical instrument or the like, suppression of leakage of noise to the outside, particularly forward of the mixer, is desired. Therefore, the conventional air conditioning structures remain to be improved in achieving a muffling effect in cooling the heat-generating electrical component parts contained in the housing.

SUMMARY OF THE INVENTION

It is a first object of the present invention to, provide an air conditioning structure for electrical appliances, which is capable of air-cooling at least one heat-generating electrical component part in a housing of the electrical appliance while suppressing leakage of operation noise from an air intake fan to the outside, and also capable of achieving a muffling effect and even enhancing the rigidity of the front part of the housing by the front part being constructed of a double structure.

It is a second object of the present invention to provide an air conditioning structure for electrical appliances, which is capable of air-cooling at least one heat-generating section in a housing of the electrical appliance while suppressing leakage of operation noise from an air intake fan to the outside, and also capable of achieving a muffling effect and even enhancing the rigidity of the front part of the housing by the front part being constructed of a double structure.

It is a third object of the present invention to provide an air conditioning structure for an electrical appliance, which is capable of air-cooling at least one heat-generating electrical component part in a housing of the electrical appliance while suppressing leakage of operation noise from an air intake fan to the outside, and also capable of achieving a muffling effect and even enhancing the rigidity of the front part of the housing due to the front part being constructed of a box structure.

To attain the above first object, in a first aspect of the present invention, there is provided an air conditioning structure for an electrical appliance having at least one heat-generating electrical component part, comprising a housing (BX) accommodating the at least one heat-generating electrical component part (65), the housing having a front part (40), and a rear part (30), the front part being formed by a double plate assembly comprising an inner plate body (50), and an outer plate body (41), at least one exhaust section (33, 34, 30b, 30c) provided in the housing at the rear part, for exhausting air within the housing from the housing, and an air intake fan (45) provided in the housing at the front part, wherein at least one outer air intake opening (41a, 41b) opening out of the housing is formed in the outer plate body of the front part of the housing, an inner air intake opening (52a) opening into the housing is formed in the inner plate body of the front part of the housing, and the air intake fan is provided rearward of the outer air intake opening in facing relation to the inner air intake opening, and disposed at such a location that it does not overlap the outer air intake opening at all as viewed from a front side of the housing, whereby the heat-generating electrical component part is air-cooled by the air intake fan and the exhaust section.

With the arrangement of the air conditioning structure according to the first aspect of the present invention, the air intake fan is disposed at such a location that it does not overlap the outer air intake opening at all as viewed from the front side. As a result, it is possible to suppress leakage of operation noise of the air intake fan from the outer air intake opening, thereby achieving a muffling effect. Further, since the front part of the housing has a double structure and comprises the double plate assembly, the rigidity of the front part is higher than in the case where the front part is formed by only a single plate. As a result, it is possible to air-cool at least one heat-generating electrical component part in the housing of the electrical appliance while suppressing leakage of operation noise from the air intake fan to the outside, as well as to achieve a muffling effect and even enhance the rigidity of the front part of the housing due to the double structure of the front part.

Preferably, the inner plate body and the outer plate body define therebetween an air guide part (ASL, ASR), for guiding air drawn via the outer air intake opening to the air intake fan.

With the arrangement of this preferred embodiment, it is possible to take in cool air from the outside efficiently to thereby enhance cooling efficiency for the heat-generating electrical component part.

Preferably, the air conditioning structure further comprises at least one dustproof part (43, 44) provided in the air guide part.

With the arrangement of this preferred embodiment, it is possible not only to provide a dustproof effect, but also to suppress transmission of sound in air guide parts to thereby provide a further enhanced soundproof effect.

Preferably, the exhaust section includes at least one exhaust fan.

With the arrangement of this preferred embodiment, it is possible to efficiently exhaust air having flowed into the housing from the same.

To attain the above second object, in a second aspect of the present invention, there is provided an air conditioning structure for an electrical appliance having at least one heat-generating electrical component part, comprising a housing (BX) accommodating the at least one heat-generating electrical component part (65), the housing having a front part (40), and a rear part (30), the front part being formed by a double plate assembly comprising an inner plate body (50), and an outer plate body (41), at least one heat-generating section (60) comprising the at least one heat-generating electrical component part (65), and a cover body (62) covering the heat-generating electrical component part, the at least one heat-generating section being accommodated in the housing, at least one exhaust section (33, 34, 30b, 30c) provided in the housing at the rear part, for exhausting air within the housing from the housing, and an air intake fan (45) provided in the housing at the front part, wherein at least one outer air intake opening (41a, 41b) opening out of the housing is formed in the outer plate body of the front part of the housing, an inner air intake opening (52a) opening into the housing is formed in the inner plate body of the front part of the housing, the air intake fan is provided rearward of the outer air intake opening in facing relation to the inner air intake opening, and disposed at such a location that it does not overlap the outer air intake opening at all as viewed from a front side of the housing, and the heat-generating section is disposed immediately behind the air intake fan, whereby the heat-generating electrical component part is air-cooled by the air intake fan and the exhaust section.

With the arrangement of the air conditioning structure according to the second aspect of the present invention, it is possible to air-cool at least one heat-generating section in the housing of the electrical appliance while suppressing leakage of operation noise from the air intake fan to the outside, as well as to achieve a muffling effect and even enhance the rigidity of the front part of the housing by the double structure of the front part.

Preferably, the cover body has formed at least one open hole (62a, 62b, 62c) therein, whereby outside air is drawn in the air intake fan and introduced into the cover, and is exhausted via the open hole while cooling the heat-generating section.

With the arrangement of this preferred embodiment, it is possible to cool the heat-generating section reliably and intensively.

Preferably, the air conditioning structure further comprises a hood (63) provided on the cover body at a location close to the air intake fan and opening toward the air intake fan.

With the arrangement of this preferred embodiment, it is possible to cool the heat-generating section more efficiently.

To attain the above third object, in a third aspect of the present invention, there is provided an air conditioning structure for an electrical appliance having at least one heat-generating electrical component part, comprising a housing (BX) accommodating the at least one heat-generating electrical component part (65), the housing having a front part (40), and a rear part (30), at least one exhaust section (33, 34, 30b, 30c) provided in the housing at the rear part, for exhausting air within the housing from the housing, and an air intake fan (45) provided in the housing at the front part, wherein at least one outer air intake opening (41a, 41b) opening out of the housing is formed in the outer plate body of the front part of the housing, an inner air intake opening (52a) opening into the housing is formed in the front part of the housing, the air intake fan is provided rearward of the outer air intake opening in facing relation to the inner air intake opening, and disposed at such a location that it does not overlap the outer air intake opening at all as viewed from a front side of the housing, and the front part of the housing has a box-like shape comprising an inner plate body (50), an outer plate body (41), and a plurality of peripheral walls (51, 53, 54, 57) extending in a direction rearward of the housing to connect between the inner plate body and the outer plate body, whereby the heat-generating electrical component part is air-cooled by the air intake fan and the exhaust section.

With the arrangement of the third aspect of the present invention, it is possible to air-cool at least one heat-generating electrical component part in the housing of the electrical appliance while suppressing leakage of operation noise from the air intake fan to the outside, as well as to achieve a muffling effect and even enhance the rigidity of the front part of the housing by the box structure of the front part.

The above and other objects, features, and advantages of the invention will become more apparent from the following detailed description taken in conjunction with the accompanying drawings.

DETAILED DESCRIPTION OF THE PREFERRED EMBODIMENTS

The present invention will now be described in detail below with reference to the drawings showing a preferred embodiment thereof.

Figure 1:
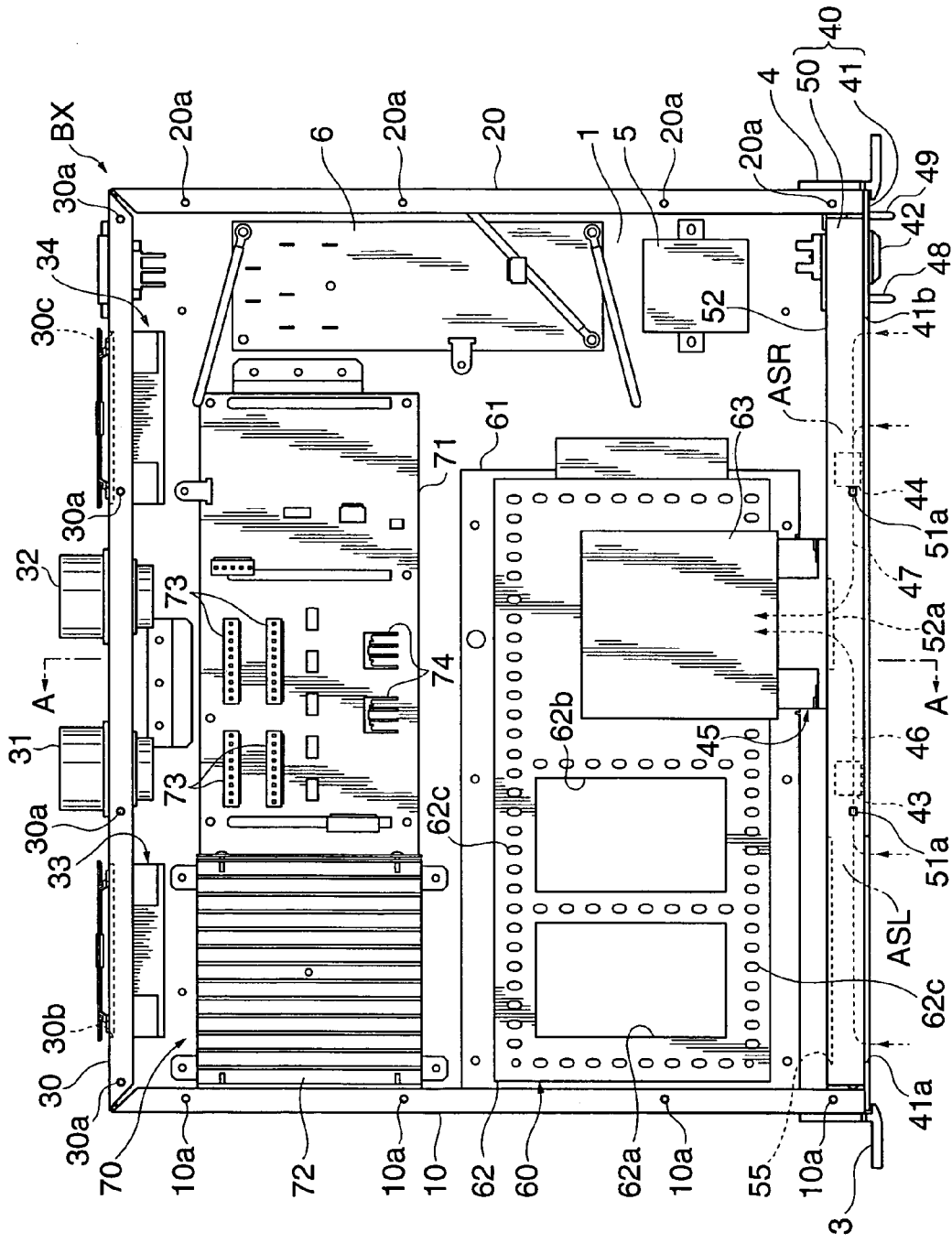
FIG. 1 is a plan view of a power supply unit to which is applied an air conditioning structure for an electrical appliance, according to an embodiment of the present invention.
Figure 2:
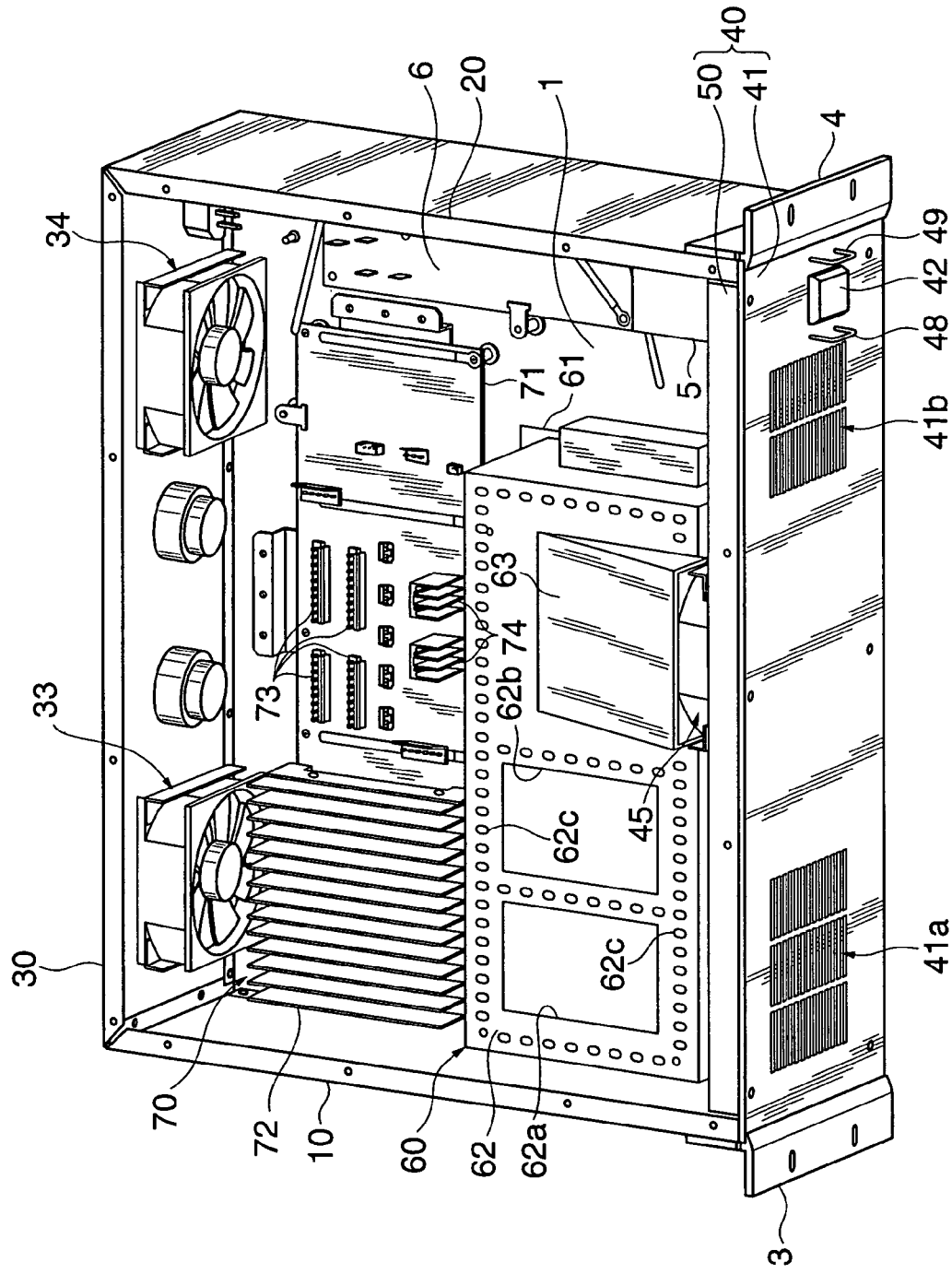
FIG. 2 is a perspective view of the power supply unit shown in FIG. 1.
Figure 3:
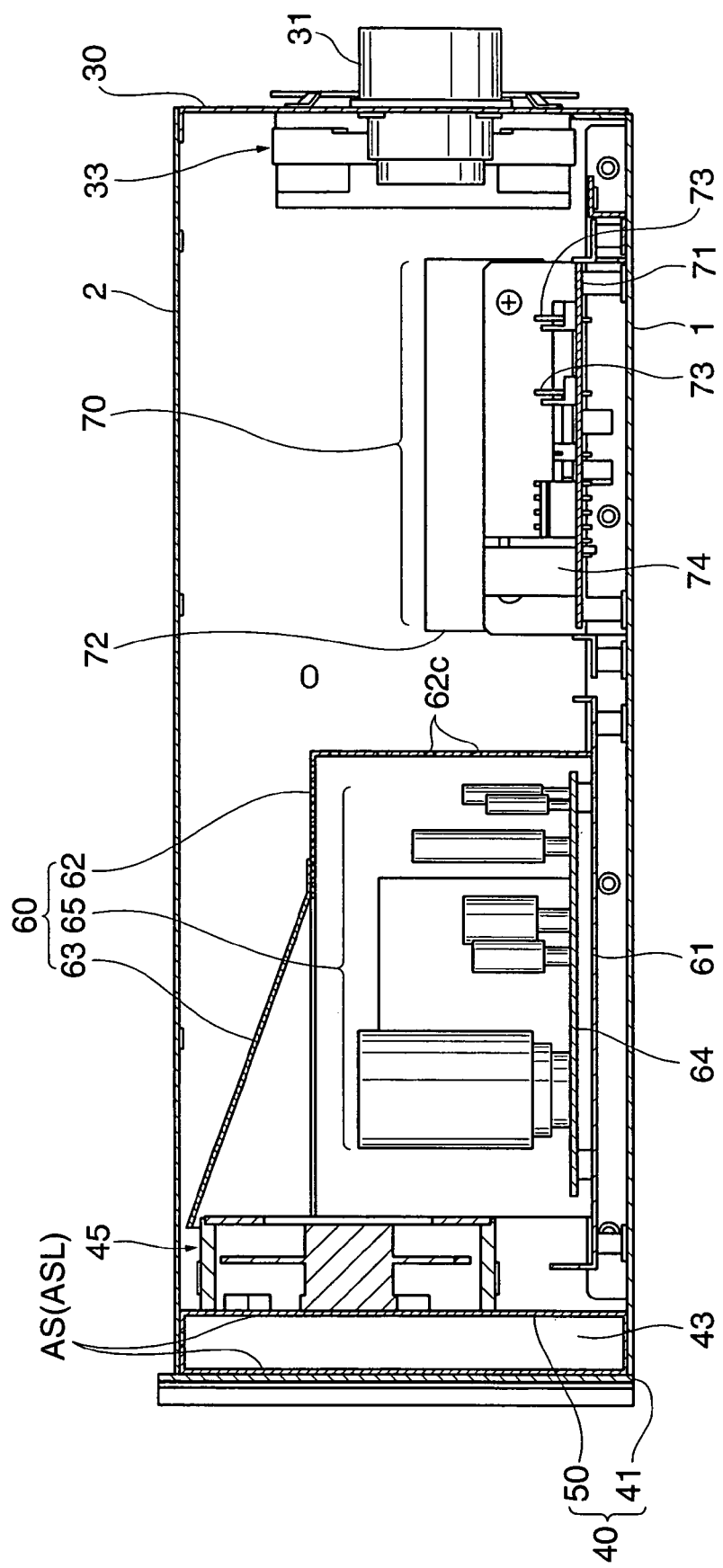
FIG. 3 is a cross-sectional view taken along line A-A in FIG. 1.

FIG. 1 is a plan view of a power supply unit to which is applied an air conditioning structure for an electrical appliance, according to an embodiment of the present invention. FIG. 2 is a perspective view of the power supply unit shown in FIG. 1. FIGS. 1 and 2 show the power supply unit in a state where a lid and electrical component parts, referred to hereinafter, are not mounted. FIG. 3 is a cross-sectional view taken along line A-A in FIG. 1.

In the present embodiment, the power supply unit for a mixer is illustrated as the electrical appliance by way of example, but the present invention may be applied to any other electrical appliance which has a housing containing one or more electrical component parts that generate heat.

As shown in FIG. 1, the present power supply unit has a housing BX containing a first heat-generating section 60, a second heat-generating section 70, and third and fourth heat-generating sections 5 and 6. The housing BX is generally in the form of a hexahedron formed by a bottom plate 1, a lid 2 (see FIG. 3), a left side plate 10, a right side plate 20, and a rear plate (rear part) 30, and a double front plate assembly (front part, double plate assembly) 40 as a front part, all of which are made of a metal. In the following description, the double front plate assembly 40 side and the right side plate 20 side in plan view will be referred to as "the front side", and "the right side", respectively. In other words, a side of the power supply unit through which outside air flows into the housing BX will be referred to as "the front side", and a side of the same through which the air having flowed into the housing BX is exhausted will be referred to as "the rear side".

The first to fourth heat-generating sections 60, 70, 5, and 6 are all disposed on the bottom plate 1. As shown in FIG. 3, the first heat-generating section 60 includes an electrical component part group 65 of a plurality of heat-generating electrical component parts, a cover body 62, and a hood 63. A mounting seat 61 is secured to a front part of the bottom plate 1, and a substrate 64 is secured to the mounting seat 61. Mounted on the substrate 64 is the electrical component part group 65 including a transformer, power transistors, and so forth. The electrical component part group 65 forms a switching-type stabilized power supply unit for suppressing sharp changes in voltage. The electrical component part group 65 generates a largest amount of heat among all the sections and component parts of the present power supply unit. Provided on the mounting seat 61 is the cover body 62 covering the electrical component part group 65. The hood 63 is provided on an upper right part of the cover body 62. As shown in FIGS. 1 and 2, open holes 62a and 62b are formed in an upper left part of the cover body 62 at a location remote from the hood 63. Further, upper and rear surfaces of the cover body 62 have formed therein numerous small open holes 62c (see FIGS. 1 and 3).

The second heat-generating section 70 is disposed on a substrate 71 fixedly secured to a rear part of the bottom plate 1. Mounted on the substrate 71 are a heat sink 72, a plurality of heat sinks 74, and a plurality of terminals 73. Connected to the terminals 73 are a plurality of various electrical component parts, not shown, that convert electric power into a plurality of voltages and distribute the voltages as DC and AC supply voltages. All these component parts form the second heat-generating section 70. Further, as shown in FIGS. 1 and 2, the third and fourth heat-generating sections 5 and 6 are disposed on a right front part of the bottom plate 1 and a right part of the same, respectively. The degrees of heat generation by the third and fourth heat-generating sections 5 and 6 are lower than that by the first heat-generating section 60.

The left side plate 10, the right side plate 20, and the rear plate 30 are fixed to left, right, and rear ends of the bottom plate 1, respectively, and formed with respective sets of a plurality of holes 10a, holes 20a, and holes 30a for use in mounting the lid 2.

As shown in FIG. 1, two connectors 31 and 32 are attached to the rear plate 30. The connector 31 is connected to a mixer, not shown, and electric power is supplied to the mixer via the connector 31. The connector 32 is connected to a backup power supply unit, not shown, which is substantially identical in configuration to the present power supply unit.

The rear plate 30 has exhaust windows 30b and 30c formed at respective locations leftward of the connector 31 and rightward of the connector 32. Exhaust fans 33 and 34 are mounted on a front surface of the rear plate 30 at respective locations corresponding to the windows 30b and 30c. The exhaust fans 33 and 34 and the windows 30b and 30c form an exhaust section for exhausting warm air rearward from the housing BX to the outside. The exhaust fans 33 and 34 are not essential to the exhaust section but only at least one of the windows 30b and 30c may form the exhaust section.

Figure 4:
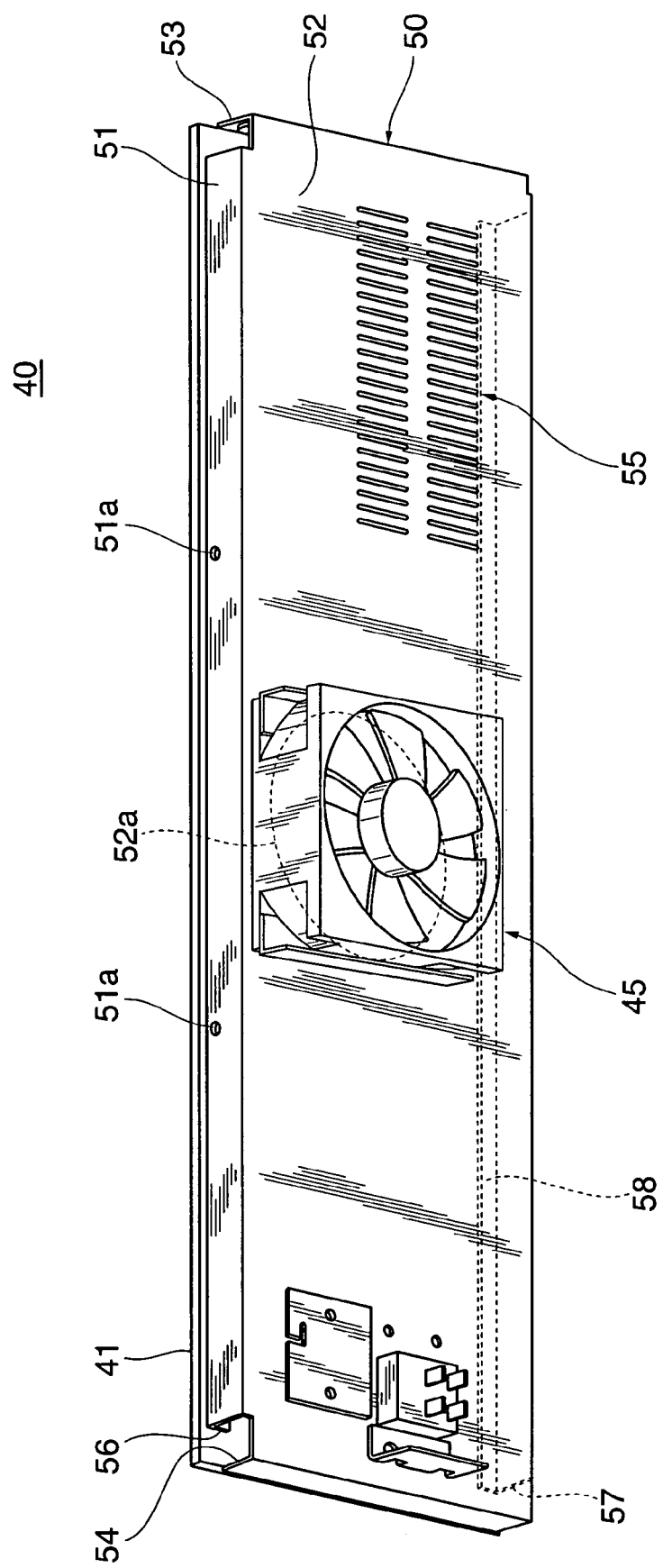
FIG. 4 is a perspective view of a double front plate assembly of the power supply unit shown in FIG. 1.

FIG. 4 is a perspective view of the double front plate assembly 40. The double front plate assembly 40 has a double structure and is comprised of a front plate (outer plate body) 41 and a rear plate (inner plate body) 50. The rear plate 50 is comprised of a rear plate body 52 in the form of a plate, and bent parts (peripheral walls) 51, 53, 54, and 57 bent forward from the rear plate body 52. The rear plate body 52 and the bent parts 51, 53, 54, and 57 form a thin box shape.

More specifically, an upper part of the rear plate 50 has the bent part 51 bent forward and extending forward, and the bent part 51 has a front end bent downward to form a mounting part 56. A lower part of the rear plate 50 also has the bent part 57 bent forward and extending forward in a vertically symmetrical relation to the upper part, and the bent part 57 has a front end bent upward to form a mounting part 58. The lower mounting part 58 and the upper mounting part 56 are rigidly screwed to a rear surface of the front plate 41, whereby the front plate 41 and the rear plate 50 are fixed to each other. As a result, a space is created between the two plates 41 and 50 to form air guide parts AS (ASL and ASR) (see FIGS. 1 and 3), referred to hereinafter. The bent part 51 is formed therein with a plurality of mounting holes 51a for use in mounting the lid 2.

Further, the rear plate 50 has left and right end parts thereof formed with respective bent parts 53 and 54 bent forward and extending forward. As shown in FIG. 1, an L-shaped mounting member 3 is fixedly screwed to the bent part 53 via a front part of the left side plate 10, and an L-shaped mounting member 4 is fixedly screwed to the bent part 54 via a front part of the right side plate 20. The present power supply unit is a rack-mount unit configured such that the whole housing BX can be held in a rack, not shown, by engaging the L-shaped mounting members 3 and 4 with the rack.

As shown in FIGS. 1 and 4, the rear plate body 52 of the rear plate 50 is formed therein with an inner air intake opening 52a which opens into the interior of the housing BX. The inner air intake opening 52a is formed in a substantially central portion of the rear plate 50 in the lateral direction of the same.

As shown in FIGS. 1 and 2, a main switch 42 is provided on a front surface of a right part of the front plate 41. Protectors 48 and 49 are disposed on the respective left and right sides of the main switch 42. Formed in the respective left and right halves of the front plate 41 are outer air intake openings 41a and 41b which open out of the housing BX. Further, an air intake fan 45 is provided slightly behind a substantially central portion of the rear plate 50 in the lateral direction. The air intake fan 45 is disposed close to the inner air intake opening 52a in facing relation to the same. The first heat-generating section 60 is located immediately behind the air intake fan 45. The outer air intake openings 41a and 41b and the air intake fan 45 are offset from each other such that the outer air intake openings 41a and 41b do not overlap the air intake fan 45 at all as viewed from the front side so as to suppress rotation noise generated by the air intake fan 45 from leaking outward, particularly forward of the power supply unit. The rear plate 50 has a rear window 55 formed in a rear surface of a left part thereof (see FIGS. 1 and 4).

The air guide parts ASL and ASR defining the spaces between the front plate 41 and the rear plate 50 perform a guiding function for guiding cool air taken in mainly through the outer air intake openings 41a and 41b to the air intake fan 45 as the air intake fan 45 is driven. The spaces defined by the air guide parts ASL and ASR are filled with dustproof parts 43 and 44 such as a glass wool material (see FIG. 1), so as to prevent fine dust or the like from flowing into the housing BX. To give top priority to cooling efficiency, however, the dustproof parts 43 and 44 may be omitted.

Further, the hood 63 has an opening thereof located closely behind the air intake fan 45 in facing relation to the same such that air sent from the air intake fan 45 is efficiently introduced into the hood 63 to directly cool the electrical component part group 65. Provision of an excessively large or small air intake area for the air intake fan 45 would reduce the blowing efficiency of the air intake fan 45, but the rear window 55 as an additional air intake area cooperates with the outer air intake openings 41a and 41b to perform the function for adjusting the flow rate of air, thereby improving the blowing efficiency of the air intake fan 45.

After component parts to be mounted have been arranged within the housing BX, the lid 2 is fixedly screwed to the left side plate 10, the right side plate 20, the rear plate 30, and the double front plate assembly 40 via the mounting holes 10a, 20a, 30a, and 51a, whereby the present power supply unit is completely assembled. When the power supply unit is in use, the air intake fan 45 and the exhaust fans 33 and 34 are driven for rotation by turning on the main switch 42 in a state where the mixer and the backup power supply unit, neither of which are shown, are connected to the present power supply unit.

With the arrangement described above, air (cool air) is drawn into the air guide parts ASL and ASR via the outer air intake openings 41a and 41b by rotation of the air intake fan 45, whereby air flow paths 46 and 47 leading from the outer air intake openings 41a and 41b to the air intake fan 45 via the inner air intake opening 52a are formed as shown in FIG. 1. The front plate 41 and the rear plate 50 are also cooled by air flowing along the air flow paths 46 and 47. The air flowing along the air flow paths 46 and 47 is subjected to dust filtering by the dustproof parts 43 and 44 on the way, and then introduced into the cover body 62 via a space inside the hood 63.

Within the cover body 62, the introduced air directly cools the electrical component part group 65 which then generates heat, and then flows out from the cover body 62 through the open holes 62a, 62b, and 62c. The majority of air having flowed out from the cover body 62 is drawn by the exhaust fans 33 and 34 while cooling the second heat-generating section 70 and the others within the housing BX, whereby it is warmed, and then the warmed air is exhausted through the windows 30b and 30c by the exhaust fans 33 and 34.

The rear window 55 provides an effect of avoiding a trap of air in the vicinity thereof to a slight extent, but it is not absolutely necessary to provide the rear window 55.

According to the present embodiment, since the air intake fan 45 and the outer air intake openings 41a and 41b are arranged such that they do not overlap as viewed from the front side, it is possible to prevent operation noise generated by the air intake fan 45 mainly during cooling of the first heat-generating section 60 from directly leaking through the outer air intake openings 41a and 41b. That is, a muffling effect of suppressing leakage of the noise to the outside can be obtained. In the present power supply unit, which is a part of an audio apparatus, suppression of noise from leaking forward of the unit is particularly desired. Therefore, the present power supply unit has increased usefulness. In addition, the dustproof parts 43 and 44 play the role of not only dustproofing but also suppressing transmission of sound through the air guide parts ASL and AS, which makes it possible to provide a further enhanced soundproof effect.

Further, the air guide parts ASL and ASR are provided to form the air flow paths 46 and 47, so that although the outer air intake openings 41a and 41b are formed at respective locations displaced from the location of the air intake fan 45, cool air can be drawn from the outside efficiently, thus achieving enhanced cooling efficiency within the housing BX. Furthermore, since the front plate 41 and the rear plate 50 are made of a metal and hence have a high thermal conductivity, air within the air guide parts ASL and ASR directly cools the front plate 41 and the rear plate 50, whereby the other component parts within the housing BX are cooled indirectly, thus achieving further enhanced cooling efficiency within the housing BX. Moreover, in the cover body 62 of the first heat-generating section 60, air flow paths leading from the hood 63 mainly to those of the open holes 62c which are formed in a rear surface of the cover body 62, are formed, so that the electrical component part group 65, which generates the largest amount of heat, within the cover body 62 can be cooled reliably and intensively. Further, since the open holes 62c are numerous, not only the cover body 62 itself but also the surrounding parts disposed outside of the cover body 62 can be easily cooled.

Additionally, according to the present embodiment, the double front plate assembly 40 has a double structure and is comprised of the front plate 41 and the rear plate 50, and hence it is possible to realize a solid power supply unit in which the housing BX has a more rigid front part, compared with a case where the front part is comprised of a single plate. In particular, since the present power supply unit is a rack-mount type, the enhanced rigidity of the front part of the housing BX makes it possible to prevent the housing BX from being deformed when it is held in a rack.

In the present embodiment, the air intake fan 45 and the outer air intake openings 41a and 41b are offset from each other so as not to overlap with each other at all as viewed from the front side. However, insofar as reduction of leakage of noise from the air intake fan 45 is concerned, the air intake fan 45 and the outer air intake openings 41a and 41b need not be fully offset from each other so as not to overlap with each other at all. The outer air intake openings 41a and 41b and the air intake fan 45 may be slightly offset to such a degree that a muffling effect can be provided.

Further, although in the present embodiment, the housing BX of the power supply unit is in the form of a hexahedron, the housing of an electrical appliance to which the present invention is applied may have any shape which allows the air intake fan 45 to be provided in the front part of the housing. For example, the front part need not be in the form of a flat plate. Further, the housing has only to be shaped such that a plurality of heat-generating component parts, such as the electrical component part group 65, can be accommodated therein, and hence it may not be formed by six plate-shaped members.

Insofar as leakage of operation noise from the air intake fan 45 can be prevented, what is essential is that the air intake fan 45 and the outer air intake openings 41a and 41b are offset, but it is not absolutely necessary to employ a double structure, such as the one formed by the front plate 41 and the rear plate 50.

Further, insofar as air can be efficiently guided from the outer air intake openings 41a and 41b to the air intake fan 45, a space between two plates forming a double structure, such as the space between the air guide parts ASL and ASR, is not essential, but a special guide part may be provided, for example.

What is claimed is:

1. An air conditioning structure for an electrical appliance having at least one heat-generating electrical component part, comprising:

a housing accommodating the at least one heat-generating electrical component part, said housing having a front part, and a rear part, said front part being formed by a double plate assembly comprising an inner plate body, and an outer plate body;

at least one exhaust section provided in said housing at said rear part, for exhausting air within said housing from said housing; and an air intake fan provided in said housing at said front part, wherein:

at least one outer air intake opening opening out of said housing is formed in said outer plate body of said front part of said housing;

an inner air intake opening opening into said housing is formed in said inner plate body of said front part of said housing; and said air intake fan is provided rearward of the outer air intake opening in facing relation to the inner air intake opening, and disposed at such a location that it does not overlap the outer air intake opening at all as viewed from a front side of said housing, whereby said heat-generating electrical component part is air-cooled by said air intake fan and said exhaust section.

2. An air conditioning structure as claimed in claim 1, wherein said inner plate body and said outer plate body define therebetween an air guide part, for guiding air drawn via the outer air intake opening to said air intake fan.

3. An air conditioning structure as claimed in claim 2, further comprising at least one dustproof part provided in said air guide part.

4. An air conditioning structure as claimed in claim 1, wherein said exhaust section includes at least one exhaust fan.

5. An air conditioning structure for an electrical appliance having at least one heat-generating electrical component part, comprising:

a housing accommodating the at least one heat-generating electrical component part, said housing having a front part, and a rear part, said front part being formed by a double plate assembly comprising an inner plate body, and an outer plate body;

at least one heat-generating section comprising the at least one heat-generating electrical component part, and a cover body covering said heat-generating electrical component part, said at least one heat-generating section being accommodated in said housing;

at least one exhaust section provided in said housing at said rear part, for exhausting air within said housing from said housing; and an air intake fan provided in said housing at said front part, wherein:

at least one outer air intake opening opening out of said housing is formed in said outer plate body of said front part of said housing;

an inner air intake opening opening into said housing is formed in said inner plate body of said front part of said housing;

said air intake fan is provided rearward of the outer air intake opening in facing relation to the inner air intake opening, and disposed at such a location that it does not overlap the outer air intake opening at all as viewed from a front side of said housing; and said heat-generating section is disposed immediately behind said air intake fan, whereby said heat-generating electrical component part is air-cooled by said air intake fan and said exhaust section.

6. An air conditioning structure as claimed in claim 5, wherein said cover body has formed at least one open hole therein, whereby outside air is drawn in said air intake fan and introduced into said cover, and is exhausted via the open hole while cooling said heat-generating section.

7. An air conditioning structure as claimed in claim 5, further comprising a hood provided on said cover body at a location close to said air intake fan and opening toward said air intake fan.

8. An air conditioning structure for an electrical appliance having at least one heat-generating electrical component part, comprising:

a housing accommodating the at least one heat-generating electrical component part, said housing having a front part, and a rear part;

at least one exhaust section provided in said housing at said rear part, for exhausting air within said housing from said housing; and an air intake fan provided in said housing at said front part, wherein:

at least one outer air intake opening opening out of said housing is formed in said front part of said housing;

an inner air intake opening opening into said housing is formed in said front part of said housing;

said air intake fan is provided rearward of the outer air intake opening in facing relation to the inner air intake opening, and disposed at such a location that it does not overlap the outer air intake opening at all as viewed from a front side of said housing; and said front part of said housing has a box-like shape comprising an inner plate body, an outer plate body, and a plurality of peripheral walls extending in a direction rearward of said housing to connect between said inner plate body and said outer plate body, whereby said heat-generating electrical component part is air-cooled by said air intake fan and said exhaust section.

* * * * *